US008912841B1

(12) United States Patent
Hwang et al.

(10) Patent No.: US 8,912,841 B1
(45) Date of Patent: Dec. 16, 2014

(54) SEMICONDUCTOR DEVICES AND SEMICONDUCTOR SYSTEMS INCLUDING THE SAME

(71) Applicant: SK hynix Inc., Icheon-si (KR)

(72) Inventors: Sun Young Hwang, Icheon-si (KR); Jun Hyun Chun, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/156,904

(22) Filed: Jan. 16, 2014

(30) Foreign Application Priority Data

Jun. 17, 2013 (KR) ........................ 10-2013-0069279

(51) Int. Cl.
*H01H 85/00* (2006.01)
*H01H 85/04* (2006.01)

(52) U.S. Cl.
CPC .................................... *H01H 85/04* (2013.01)
USPC .......................................... 327/525; 327/143

(58) Field of Classification Search
CPC ....................................................... G11C 17/16
USPC ................................. 327/142, 143, 524, 525
See application file for complete search history.

(56) References Cited

U.S. PATENT DOCUMENTS 5,929,691 A * 7/1999 Kim et al. ..................... 327/525
7,825,704 B2 * 11/2010 McClure ....................... 327/142
7,940,116 B2 * 5/2011 Park ............................. 327/525
2010/0225330 A1 9/2010 Watanabe

FOREIGN PATENT DOCUMENTS

KR 1020050102305 A 10/2005

* cited by examiner

*Primary Examiner* — Jeffrey Zweizig
(74) *Attorney, Agent, or Firm* — William Park & Associates Patent Ltd.

(57) ABSTRACT

Semiconductor systems are provided. The semiconductor system includes a controller and a semiconductor device. The controller generates a power voltage signal. The semiconductor device generates a power-up signal in response to the power voltage signal, generates a first selection pulse, a second selection pulse and an initialization pulse signal, generates a first fuse signal for controlling an internal operation according to a cut state of a first fuse, and generates a second fuse signal for controlling the internal operation according to a cut state of a second fuse.

20 Claims, 7 Drawing Sheets

23
231
VDD VDD VDD
F21 F22 F23
nd21 nd22 nd23
SELP1 P21 SELP2 P22 SELP3 P23
233
IV21
nd24 nd25
FUSE_PRE
N22
INTP N21
VSS VSS
232
234 235 236
SELP1 SELP2 SELP3
T21 T22 T23
nd26 nd27 nd28
FUSEN1 FUSEN2 FUSEN3

23
232
234
235
236
FUSEN1
FUSEN2
FUSEN3
nd26
nd27
nd28
T21
T22
T23
SELP1
SELP2
SELP3
FUSE_PRE
231
233
nd25
IV21
N22
VSS
VDD
F21
F22
F23
nd21
nd22
nd23
P21
P22
P23
nd24
N21
INTP

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(*a*) to Korean Application No. 10-2013-0069279, filed on Jun. 17, 2013, in the Korean Intellectual Property Office, which is incorporated herein by reference in its entirety as set forth in full.

BACKGROUND

1. Technical Field

Embodiments of the present disclosure relate to semiconductor integrated circuits and, more particularly, to semiconductor devices and semiconductor systems including the same.

2. Description of Related Art

Semiconductor devices may operate in various modes and utilize an option processing method to change the mode. In general, the option processing method may include a bonding option, a metal option and a fuse option. The fuse option may be widely used to replace failed memory cells abnormally formed during fabrication processes with redundancy memory cells. Further, the fuse option may also be widely used to change design schemes of the semiconductor devices. The fuse option may be performed by irradiating a laser beam onto the corresponding fuse or forcing an over-current into the corresponding fuse to cut the corresponding fuse. Each of the semiconductor devices may have a plurality of fuses, and the fuse option may be performed by a fuse signal which is generated according to the cut states of the plurality of fuses.

SUMMARY

Various embodiments are directed to semiconductor devices and semiconductor systems including the same.

According to various embodiments, a semiconductor system includes a controller and a semiconductor device. The controller generates a power voltage signal. The semiconductor device generates a power-up signal in response to the power voltage signal and generates a first selection pulse, a second selection pulse and an initialization pulse signal. Further, the semiconductor device generates a first fuse signal for controlling an internal operation according to a cut state of a first fuse and generates a second fuse signal for controlling the internal operation according to a cut state of a second fuse.

According to various embodiments, a semiconductor device includes a pre-fuse signal generator and a selection transmitter. The pre-fuse signal generator generates a pre-fuse signal whose level is determined according to a cut state of a first fuse and generates the pre-fuse signal whose level is determined according to a cut state of a second fuse. The selection transmitter outputs the pre-fuse signal as a first fuse signal when a first selection pulse is generated and outputs the pre-fuse signal as a second fuse signal when a second selection pulse is generated.

According to various embodiments, a semiconductor system includes a controller and a semiconductor device. The controller suitable for generating a period signal. The semiconductor device generates a first selection pulse, a second selection pulse and an initialization pulse signal in response to the period signal. In addition, the semiconductor device generates a first fuse signal for controlling an internal operation according to a cut state of a first fuse in response to the first selection pulse and generates a second fuse signal for controlling the internal operation according to a cut state of a second fuse in response to the second selection pulse.

In accordance with an embodiment, a system comprises: a processor; a controller suitable for receiving a request and a data from the processor; and a memory unit suitable for receiving the request and the data from the controller, wherein the controller is suitable for generating a power voltage signal, suitable for generating a power-up signal in response to the power voltage signal, suitable for generating a first selection pulse, a second selection pulse and an initialization pulse, suitable for generating a first fuse signal for controlling an internal operation according to a cut state of a first fuse, and suitable for generating a second fuse signal for controlling the internal operation according to a cut state of a second fuse.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
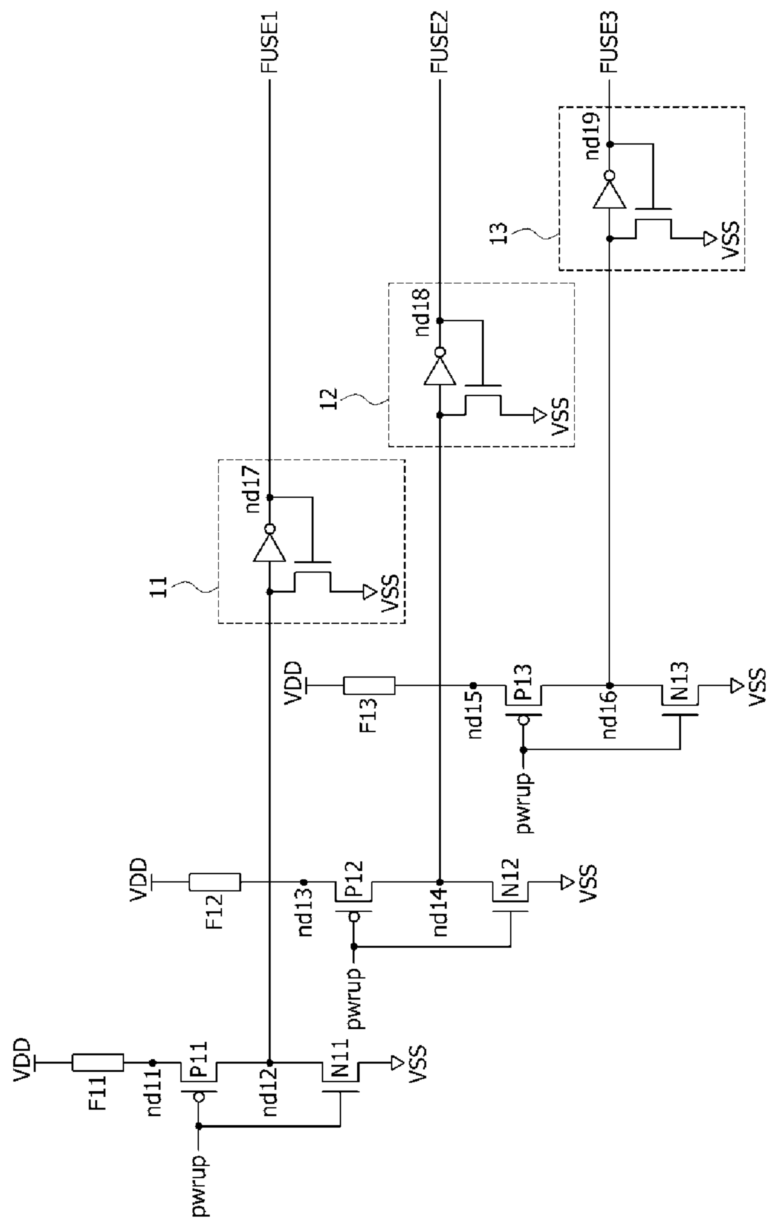
FIG. 1 is a circuit diagram illustrating a fuse signal generator according to the general inventive concept.

Referring to FIG. 1, a fuse signal generator according to a general inventive concept may include fuses F11, F12 and F13, PMOS transistors P11, P12 and P13, NMOS transistors N11, N12 and N13, and latch units 11, 12 and 13. The fuse F11 may be coupled between a power voltage VDD terminal and a node ND11, and the fuse F12 may be coupled between the power voltage VDD terminal and a node ND13. Further, the fuse F13 may be coupled between the power voltage VDD terminal and a node ND15. The PMOS transistor P11 may be coupled between the node ND11 and a node ND12 and may be turned on or turned off in response to a power-up signal PWRUP. The NMOS transistor N11 may be coupled between the node ND12 and a ground voltage terminal VSS and may be turned on or turned off in response to the power-up signal PWRUP. The PMOS transistor P12 may be coupled between the node ND13 and a node ND14 and may be turned on or turned off in response to the power-up signal PWRUP. The NMOS transistor N12 may be coupled between the node ND14 and the ground voltage terminal VSS and may be turned on or turned off in response to the power-up signal PWRUP. The PMOS transistor P13 may be coupled between the node ND16 and a node ND16 and may be turned on or turned off in response to the power-up signal PWRUP. The NMOS transistor N13 may be coupled between the node ND16 and the ground voltage terminal VSS and may be turned on or turned off in response to the power-up signal PWRUP. The latch unit 11 may buffer a signal on the node ND12 to output the buffered signal as a first fuse signal FUSE1 through a node ND17. The latch unit 11 also illustrates the ground voltage terminal VSS. The latch unit 11 may latch a data having a logic "high" level at the node ND17. The latch unit 12 may buffer a signal on the node ND14 to output the buffered signal as a second fuse signal FUSE2 through a node ND18. The latch unit 12 may also illustrate the ground voltage terminal VSS. The latch unit 12 may latch a data having a logic "high" level at the node ND18. The latch unit 13 may buffer a signal on the node ND16 to output the buffered signal as a third fuse signal FUSE3 through a node ND19. The latch unit 13 may latch a data having a logic "high" level at the node ND19. The latch unit 13 may also illustrate the ground voltage terminal VSS.

The aforementioned fuse signal generator may generate the first, second and third fuse signals FUSE1, FUSE2 and FUSE3 in response to the power-up signal PWRUP changing from a logic "high" level into a logic "low" level when a level of the power voltage VDD reaches a predetermined level. An operation of the fuse signal generator shown in FIG. 1 will be described more fully hereinafter.

First, in a power-up period before the power voltage VDD reaches the predetermined level, the NMOS transistors N11, N12 and N13 may be turned on by the power-up signal PWRUP having a logic "high" level and the nodes ND12, ND14 and ND16 may be driven to have a logic "low" level. Thus, all the first, second and third fuse signals FUSE1, FUSE2 and FUSE3 may be initialized to have a logic "high" level.

Next, if the power voltage VDD reaches the predetermined level and the power-up signal PWRUP changes from a logic "high" level into a logic "low" level, logic levels of the first, second and third fuse signals FUSE1, FUSE2 and FUSE3 may be determined according to whether the fuses are cut or not. For example, if the fuses F11 and F12 are cut and the fuse F13 is not cut, the first and second fuse signals FUSE1 and FUSE2 may still maintain a logic "high" level and the third fuse signal FUSE3 may change from a logic "high" level into a logic "low" level.

Figure 2:
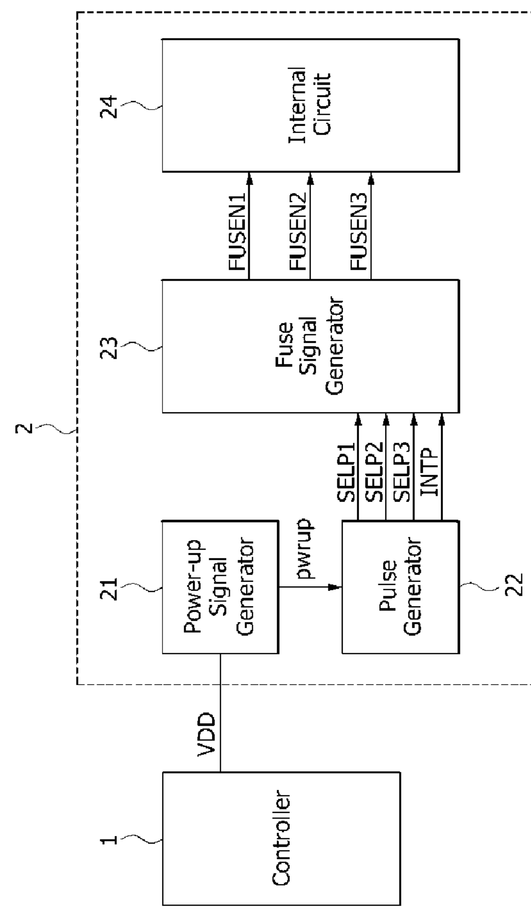
FIG. 2 is a block diagram illustrating a semiconductor system according to various embodiments of the present invention.

Referring to FIG. 2, a semiconductor system according to various embodiments of the present invention may include a controller 1 and a semiconductor device 2. The controller 1 may generate a power voltage signal VDD. The semiconductor device 2 may include a power-up signal generator 21, a pulse generator 22, a fuse signal generator 23 and an internal circuit 24.

In a power-up period from a moment that the power voltage signal VDD is applied until a moment that the power voltage signal VDD reaches a predetermined level, the power-up signal generator 21 may generate a power-up signal PWRUP which is ramped up to have the same level as the power voltage signal VDD in response to the power voltage signal VDD. The power-up signal PWRUP may change from a logic "high" level into a logic "low" level at a point of time that the power-up period terminates. That is, the power-up signal PWRUP may change from a logic "high" level into a logic "low" level after the power voltage signal VDD reaches the predetermined level.

The pulse generator 22 may generate a first selection pulse SELP1, a second selection pulse SELP2, a third selection pulse SELP3 and an initialization pulse signal INTP from a point of time that the power-up signal PWRUP is changed from a logic "high" level into a logic "low" level. The first, second and third selection pulses SELP1, SELP2 and SELP3 may be sequentially generated. The initialization pulse signal INTP may include first to third pulses (not shown). The first pulse may be generated after the first selection pulse SELP1 is generated, and the second pulse may be generated after the second selection pulse SELP2 is generated. Further, the third pulse may be generated after the third selection pulse SELP3 is generated.

If the first selection pulse SELP1 is generated, the fuse signal generator 23 may initialize a level of a predetermined node (not shown) using the first pulse included in the initialization pulse signal INTP after setting a level of a first fuse signal FUSEN1, wherein the level of the predetermined node may be controlled according to cut states of a first and second fuse. If the second selection pulse SELP2 is generated, the fuse signal generator 23 may initialize a level of the predetermined node using the second pulse included in the initialization pulse signal INTP after setting a level of a second fuse signal FUSEN2. If the third selection pulse SELP3 is generated, the fuse signal generator 23 may initialize a level of the predetermined node using the third pulse included in the initialization pulse signal INTP after setting a level of a third fuse signal FUSEN3. Accordingly, the semiconductor device 2 may be suitable for generating a power-up signal PWRUP in response to the power voltage signal VDD; suitable for generating a first selection pulse SELP1, a second selection pulse SELP2 and an initialization pulse signal INTP in response to the power-up signal PWRUP; suitable for generating a first fuse signal FUSEN1 for controlling an internal operation according to a cut state of a first fuse in response to the first selection pulse SELP1; and suitable for generating a second fuse signal FUSEN1 for controlling the internal operation according to a cut state of a second fuse in response to the second selection pulse SELP2.

The internal circuit 24 may perform an internal operation thereof according to a level combination of the first, second and third fuse signals FUSEN1, FUSEN2 and FUSEN3. The internal operation of the internal circuit 24 may include a repair operation for replacing failed memory cells with redundancy memory cells, an operation for changing a design scheme, and an operation for changing a mode.

Figure 3:
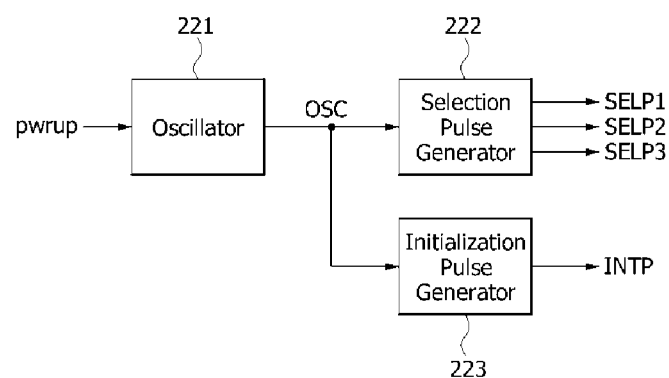
FIG. 3 is a block diagram illustrating a pulse generator included in the semiconductor system of FIG. 2.

Referring to FIG. 3, the pulse generator 22 may include an oscillator 221, a selection pulse generator 222 and an initialization pulse generator 223.

The oscillator 221 may generate an oscillation signal OSC having a predetermined cycle time in response to the power-up signal PWRUP which is changed from a logic "high" level into a logic "low" level at a point of time that the power-up period (i.e., a period from a moment that the power voltage signal VDD is applied until a moment that the power voltage signal VDD reaches a predetermined level) terminates.

The selection pulse generator 222 may generate the first selection pulse SELP1 in synchronization with a first rising edge of the oscillation signal OSC. The selection pulse generator 222 may generate the second selection pulse SELP2 in synchronization with a second rising edge of the oscillation signal OSC. Further, the selection pulse generator 222 may generate the third selection pulse SELP3 in synchronization with a third rising edge of the oscillation signal OSC.

The initialization pulse generator 223 may generate the initialization pulse signal INTP including first to third pulses in response to the oscillation signal OSC. The first pulse of the initialization pulse signal INTP may be generated in synchronization with a first falling edge of the oscillation signal OSC, and the second pulse of the initialization pulse signal INTP may be generated in synchronization with a second falling edge of the oscillation signal OSC. In addition, the third pulse of the initialization pulse signal INTP may be generated in synchronization with a third falling edge of the oscillation signal OSC.

Figure 4:
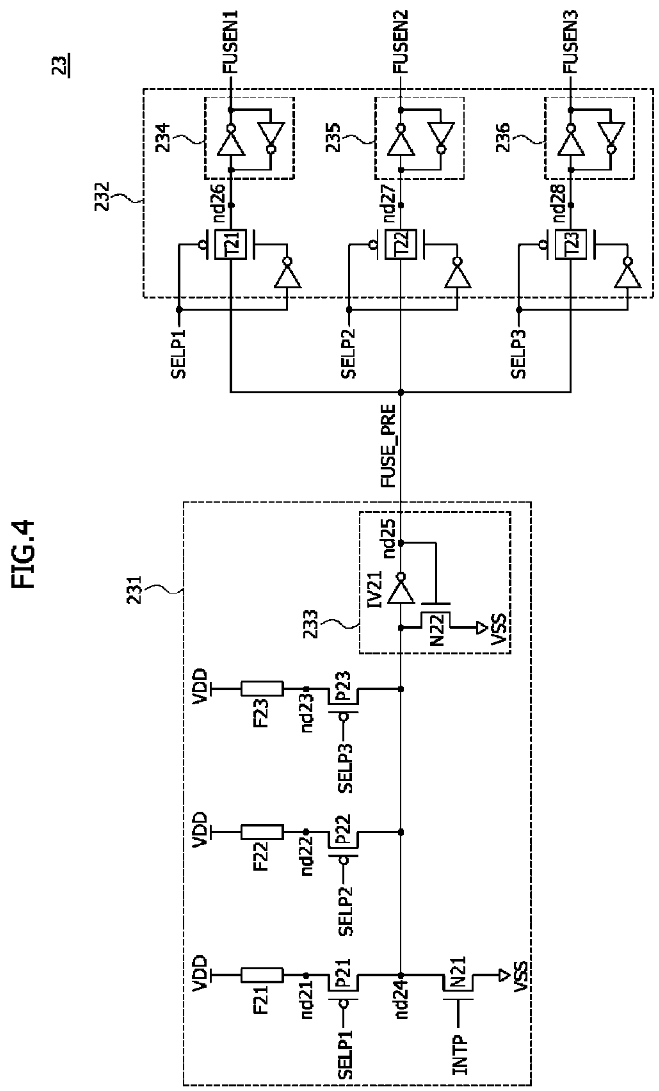
FIG. 4 is a circuit diagram illustrating a fuse signal generator included in the semiconductor system of FIG. 2.
Figure 5:
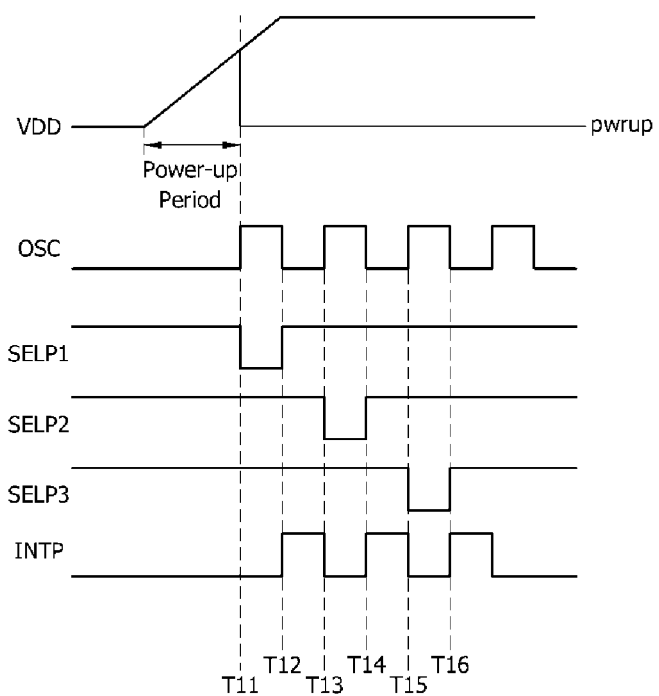
FIG. 5 is a timing diagram illustrating an operation of the semiconductor system shown in FIG. 2.

Referring to FIG. 4, the fuse signal generator 23 may include a pre-fuse signal generator 231 and a selection transmitter 232.

The pre-fuse signal generator 231 may include first to third fuses F21, F22 and F23, first to third switching elements P21, P22 and P23, a driving element N21, and a latch unit 233. The first fuse F21 may be coupled between a power voltage terminal VDD and a node ND21, and the second fuse F22 may be coupled between the power voltage terminal VDD and a node ND22. Further, the third fuse F23 may be coupled between the power voltage terminal VDD and a node ND23. The first switching element P21 may be coupled between the node ND21, the first fuse F21 and a predetermined node ND24 and may be turned on when the first selection pulse SELP1 is generated to determine a level of the predetermined node ND24. The second switching element P22 may be coupled between the node ND22, the second fuse F22 and the predetermined node ND24 and may be turned on when the second selection pulse SELP2 is generated to determine a level of the predetermined node ND24. The third switching element P23 may be coupled between the node ND23, the third fuse F23 and the predetermined node ND24 and may be turned on when the third selection pulse SELP3 is generated. The driving element N21 may be coupled between the predetermined node ND24 and a ground voltage terminal VSS and may be turned on in response to the initialization pulse signal INTP. The driving element N21 may drive a level of the predetermined node ND24 whenever the first pulse and second pulse of the initialization pulse signal INTP are inputted. The latch unit 233 may buffer a voltage signal of the predetermined node ND24 to output the buffered voltage signal as a pre-fuse signal FUSE_PRE through a node ND25. The latch unit 233 may include an NMOS transistor N22 coupled between the node ND24 and the ground voltage terminal VSS, and the NMOS transistor N22 may be turned on when the pre-fuse signal FUSE_PRE has a logic “high” level. Thus, the latch unit 233 may latch levels of the nodes ND24 and ND25 and may include an inverter IV21. The pre-fuse signal generator 231 may be suitable for generating a pre-fuse signal FUSE_PRE whose level may be determined according to a cut state of a first fuse when the first selection pulse SELP1 is generated; and suitable for generating the pre-fuse signal FUSE_PRE whose level may be determined according to a cut state of the second fuse when the second selection pulse SELP2 is generated.

The selection transmitter 232 may include transfer elements T21, T22 and T23 and latch units 234, 235 and 236. If the first selection pulse SELP1 is generated, the transfer element T21 may be turned on to transmit the pre-fuse signal FUSE_PRE to a node ND26. If the second selection pulse SELP2 is generated, the transfer element T22 may be turned on to transmit the pre-fuse signal FUSE_PRE to a node ND27. If the third selection pulse SELP3 is generated, the transfer element T23 may be turned on to transmit the pre-fuse signal FUSE_PRE to a node ND28. The latch unit 234 may buffer and latch a signal of the node ND26 to generate the first fuse signal FUSEN1. The latch unit 235 may buffer and latch a signal of the node ND27 to generate the second fuse signal FUSEN2. The latch unit 236 may buffer and latch a signal of the node ND28 to generate the third fuse signal FUSEN3.

The aforementioned fuse signal generator 23 may generate the first fuse signal FUSEN1 according to whether the first fuse F21 is cut or not when the first selection pulse SELP1 is inputted. Further, the aforementioned fuse signal generator 23 may generate the second fuse signal FUSEN2 according to whether the second fuse F22 is cut or not when the second selection pulse SELP2 is inputted. Moreover, the aforementioned fuse signal generator 23 may generate the third fuse signal FUSEN3 according to whether the third fuse F23 is cut or not when the third selection pulse SELP3 is inputted. For example, when the first and second fuses F21 and F22 are cut and the third fuse F23 is not cut, the fuse signal generator 23 may generate the pre-fuse signal FUSE_PRE having a logic “high” level to output the first fuse signal FUSEN1 having a logic “low” level if the first selection pulse SELP1 is inputted. Further, when the first and second fuses F21 and F22 are cut and the third fuse F23 is not cut, the fuse signal generator 23 may generate the pre-fuse signal FUSE_PRE having a logic “high” level to output the second fuse signal FUSEN2 having a logic “low” level if the second selection pulse SELP2 is inputted. Moreover, when the first and second fuses F21 and F22 are cut and the third fuse F23 is not cut, the fuse signal generator 23 may generate the pre-fuse signal FUSE_PRE having a logic “low” level to output the third fuse signal FUSEN3 having a logic “high” level if the third selection pulse SELP3 is inputted.

An operation of the semiconductor system set forth above will be described with reference to FIGS. 2, 3, 4 and 5 in conjunction with an example that the first and second fuses F21 and F22 are cut and the third fuse F23 is not cut.

First, if the power voltage signal VDD is generated, the power-up signal PWRUP may ramp up to have the same level as the power voltage signal VDD and may changes from a logic “high” level into a logic “low” level at a point of time “T11” that the power-up period terminates. The oscillation signal OSC having a predetermined cycle time may be generated by the power-up signal PWRUP at the point of time “T11” that the power-up period terminates.

Next, the first, second and third selection pulses SELP1, SELP2 and SELP3 and the initialization pulse signal INTP may be generated in response to the oscillation signal OSC. In more detail, the first selection pulse SELP1 may be generated at the point of time “T11” that is synchronized with a first rising edge of the oscillation signal OSC, and the second selection pulse SELP2 may be generated at a point of time “T13” that is synchronized with a second rising edge of the oscillation signal OSC. Further, the third selection pulse SELP3 may be generated at a point of time “T15” that is synchronized with a third rising edge of the oscillation signal OSC. The initialization pulse signal INTP may include first, second and third pulses. The first pulse of the initialization pulse signal INTP may be generated at a point of time “T12” that is synchronized with a first falling edge of the oscillation signal OSC, and the second pulse of the initialization pulse signal INTP may be generated at a point of time “T14” that is synchronized with a second falling edge of the oscillation signal OSC. In addition, the third pulse of the initialization pulse signal INTP may be generated at a point of time “T16” that is synchronized with a third falling edge of the oscillation signal OSC.

Subsequently, the first, second and third fuse signals FUSEN1, FUSEN2 and FUSEN3 may be sequentially generated in response to the first, second and third selection pulses SELP1, SELP2 and SELP3 and the initialization pulse signal INTP. Specifically, when the first and second fuses F21 and F22 are cut and the third fuse F23 is not cut, the fuse signal generator 23 may internally generate the pre-fuse signal FUSE_PRE having a logic "high" level to output the first fuse signal FUSEN1 having a logic "low" level if the first selection pulse SELP1 is inputted and may internally generate the pre-fuse signal FUSE_PRE having a logic "high" level to output the second fuse signal FUSEN2 having a logic "low" level if the second selection pulse SELP2 is inputted. In addition, when the first and second fuses F21 and F22 are cut and the third fuse F23 is not cut, the fuse signal generator 23 may internally generate the pre-fuse signal FUSE_PRE having a logic "low" level to output the third fuse signal FUSEN3 having a logic "high" level if the third selection pulse SELP3 is inputted.

As described above, the semiconductor system according to the embodiments may sequentially generate the first, second and third fuse signals FUSEN1, FUSEN2 and FUSEN3 that control an operation of the internal circuit using the first, second and third selection pulses SELP1, SELP2 and SELP3 which are sequentially generated. Because the first, second and third fuse signals FUSEN1, FUSEN2 and FUSEN3 are sequentially generated, abrupt power consumption may be prevented. This may lead to a stable supply of the power voltage VDD without any voltage level drops. Further, the first, second and third fuses F21, F22 and F23 may share the latch unit 233 to reduce a planar area that a circuit generating the first, second and third fuses F21, F22 and F23 occupies.

Figure 6:
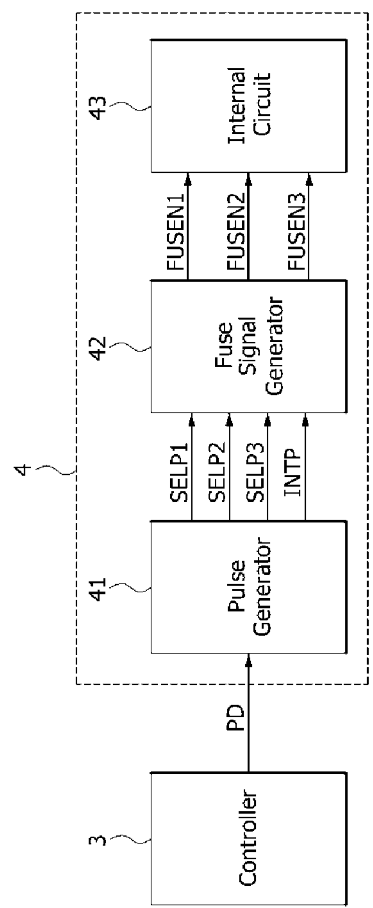
FIG. 6 is a block diagram illustrating another semiconductor system according to various embodiments of the present invention.

Referring to FIG. 6, another semiconductor system according to various embodiments of the present invention may include a controller 3 and a semiconductor device 4. The controller 3 may generate a period signal PD. The period signal PD may be enabled for a predetermined period. The enabled period of the period signal PD may vary according to the embodiments. In an embodiment, the enabled period of the period signal PD may be set to be a power-up period from a moment that the power voltage signal VDD is applied until a moment that the power voltage signal VDD reaches a predetermined level. The semiconductor device 4 may include a pulse generator 41, a fuse signal generator 42 and an internal circuit 43.

The pulse generator 41 may generate a first selection pulse SELP1, a second selection pulse SELP2, a third selection pulse SELP3 and an initialization pulse signal INTP from a point of time that the enabled period of the period signal PD terminates. The first, second and third selection pulses SELP1, SELP2 and SELP3 may be sequentially generated. The initialization pulse signal INTP may include first to third pulses (not shown). The first pulse may be generated after the first selection pulse SELP1 is generated, and the second pulse may be generated after the second selection pulse SELP2 is generated. Further, the third pulse may be generated after the third selection pulse SELP3 is generated.

If the first selection pulse SELP1 is generated, the fuse signal generator 42 may initialize a level of a predetermined node (not shown) using the first pulse included in the initialization pulse signal INTP after setting a level of a first fuse signal FUSEN1. If the second selection pulse SELP2 is generated, the fuse signal generator 42 may initialize a level of the predetermined node using the second pulse included in the initialization pulse signal INTP after setting a level of a second fuse signal FUSEN2. If the third selection pulse SELP3 is generated, the fuse signal generator 42 may initialize a level of the predetermined node using the third pulse included in the initialization pulse signal INTP after setting a level of a third fuse signal FUSEN3. Accordingly, the semiconductor device 4 may be suitable for generating a first selection pulse SELP1, a second selection pulse SELP2 and an initialization pulse INTP in response to the period signal PD; suitable for generating a first fuse signal FUSEN1 for controlling an internal operation according to a cut state of a first fuse in response to the first selection pulse SELP1; and suitable for generating a second fuse signal FUSEN1 for controlling the internal operation according to a cut state of a second fuse in response to the second selection pulse SELP2.

The internal circuit 43 may perform an internal operation thereof according to a level combination of the first, second and third fuse signals FUSEN1, FUSEN2 and FUSEN3. The internal operation of the internal circuit 43 may include a repair operation for replacing failed memory cells with redundancy memory cells, an operation for changing a design scheme, and an operation for changing a mode.

Figure 7:
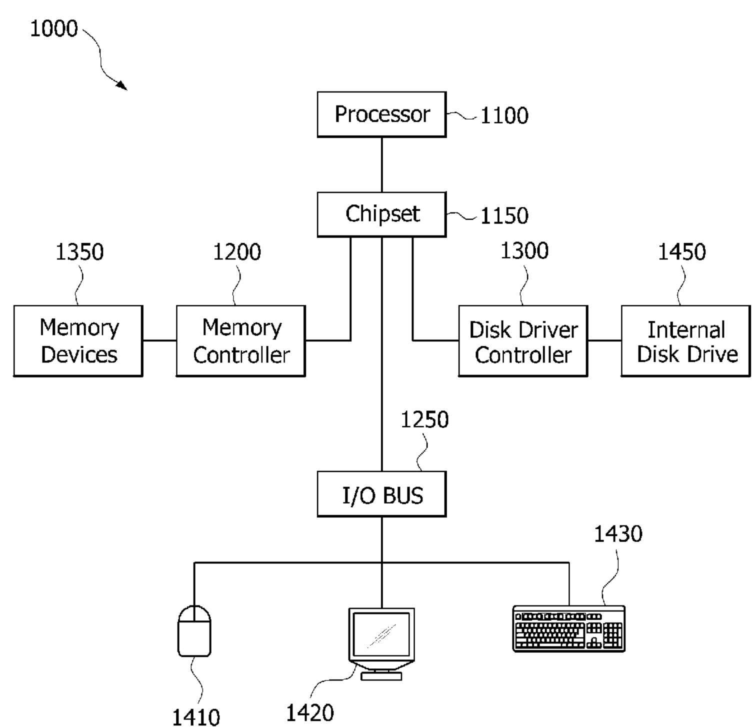
FIG. 7 illustrates a block diagram of a system in accordance with an embodiment of the invention.

Referring to FIG. 7, a system 1000 may include one or more processors or central processing units ("CPUs") 1100. The processor 1100 may be used individually or in combination with other CPUs.

A chipset 1150 may be operably coupled to the CPU 1100. The chipset 1150 is a communication pathway for signals between the CPU 1100 and other components of the system 1000, which may include a memory controller 1200, an input/output("I/O") bus 1250, and a disk drive controller 1300. Depending on the configuration of the system, any one of a number of different signals may be transmitted through the chipset 1150.

The memory controller 1200 may be operably coupled to the chipset 1150. The memory controller 1200 may include at least one memory controller which delays the generation of the address signal, and blocks consecutive accesses, of which the number exceeds the predetermined critical value, to the same word line or the same bit line of a selected memory bank of a memory unit. The memory controller 1200 may include the semiconductor system described above, and can receive a request provided from the CPU 1100 through the chipset 1150. The memory controller 1200 may be operably coupled to one or more memory devices 1350.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be operably coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

What is claimed is:

1. A semiconductor system comprising:

a controller suitable for generating a power voltage signal; and a semiconductor device suitable for generating a power-up signal in response to the power voltage signal, suitable for generating a first selection pulse, a second selection pulse and an initialization pulse signal in response to the power-up signal, suitable for generating a first fuse signal for controlling an internal operation according to a cut state of a first fuse in response to the first selection pulse, and suitable for generating a second fuse signal for controlling the internal operation according to a cut state of a second fuse in response to the second selection pulse.

2. The semiconductor system of claim 1, wherein a level of the power-up signal is changed when the power voltage signal reaches a predetermined level.

3. The semiconductor system of claim 1, wherein the first and second selection pulses are sequentially generated.

4. The semiconductor system of claim 3:

wherein the initialization pulse signal includes a first pulse and a second pulse;

wherein the first pulse is generated after the first selection pulse is generated; and wherein the second pulse is generated after the second selection pulse is generated.

5. The semiconductor system of claim 4, wherein the initialization pulse signal is applied to initialize a level of a predetermined node and the level of the predetermined node is controlled according to the cut states of the first and second fuses.

6. The semiconductor system of claim 1, wherein the semiconductor device includes:

a power-up signal generator suitable for generating the power-up signal in response to the power voltage signal;

a pulse generator suitable for generating the first and second selection pulses and the initialization pulse signal in response to the power-up signal; and a fuse signal generator suitable for generating the first and second fuse signals for controlling the internal operation in response to the first and second selection pulses, wherein the first and second selection pulses are sequentially generated, the initialization pulse signal includes a first pulse and a second pulse, the first pulse is generated after the first selection pulse is generated, and the second pulse is generated after the second selection pulse is generated.

7. The semiconductor system of claim 6, wherein the pulse generator includes:

an oscillator suitable for generating an oscillation signal in response to the power-up signal;

a selection pulse generator suitable for the first and second selection pulses in response to the oscillation signal; and an initialization pulse generator suitable for generating the initialization pulse signal in response to the oscillation signal.

8. The semiconductor system of claim 7, wherein the first selection pulse is generated in synchronization with a first edge of the oscillation signal, and the second selection pulse is generated in synchronization with a second edge of the oscillation signal.

9. The semiconductor system of claim 8, wherein the first pulse of the initialization pulse signal is generated in synchronization with a third edge of the oscillation signal, and the second pulse of the initialization pulse signal is generated in synchronization with a fourth edge of the oscillation signal.

10. The semiconductor system of claim 9, wherein the first edge is a first rising edge of the oscillation signal, the second edge is a second rising edge of the oscillation signal, the third edge is a first falling edge of the oscillation signal, and the fourth edge is a second falling edge of the oscillation signal.

11. The semiconductor system of claim 6, wherein the fuse signal generator includes:

a pre-fuse signal generator suitable for generating a pre-fuse signal whose level is determined according to a cut state of the first fuse when the first selection pulse is generated and suitable for generating the pre-fuse signal whose level is determined according to a cut state of the second fuse when the second selection pulse is generated; and a selection transmitter suitable for outputting the pre-fuse signal as the first fuse signal when the first selection pulse is generated and suitable for outputting the pre-fuse signal as the second fuse signal when the second selection pulse is generated.

12. The semiconductor system of claim 11, wherein the pre-fuse signal generator includes:

a first switching element coupled between the first fuse and a predetermined node and turned on to determine a level of the predetermined node when the first selection pulse is generated;

a second switching element coupled between the second fuse and the predetermined node and turned on to determine the level of the predetermined node when the second selection pulse is generated; and a latch unit suitable for buffering a signal of the predetermined node to generate the pre-fuse signal and suitable for latching the signal of the predetermined node.

13. The semiconductor system of claim 12, wherein the pre-fuse signal generator further includes a driving element coupled to the predetermined node to drive a level of the predetermined node whenever the first and second pulses of the initialization pulse signal are inputted.

14. A semiconductor device comprising:

a pre-fuse signal generator suitable for generating a pre-fuse signal whose level is determined according to a cut state of a first fuse when a first selection pulse is generated and suitable for generating the pre-fuse signal whose level is determined according to a cut state of a second fuse when a second selection pulse is generated; and a selection transmitter suitable for outputting the pre-fuse signal as a first fuse signal when the first selection pulse is generated and suitable for outputting the pre-fuse signal as a second fuse signal when the second selection pulse is generated.

15. The semiconductor device of claim 14, wherein the first and second selection pulses are sequentially generated after a power voltage signal reaches a predetermined level.

16. The semiconductor device of claim 14, wherein the pre-fuse signal generator includes:

a first switching element coupled between the first fuse and a predetermined node and turned on to determine a level of the predetermined node when the first selection pulse is generated; and a second switching element coupled between the second fuse and the predetermined node and turned on to determine the level of the predetermined node when the second selection pulse is generated.

17. The semiconductor device of claim 16, wherein the pre-fuse signal generator further includes:

a driving element coupled to the predetermined node to drive a level of the predetermined node whenever first and second pulses of a initialization pulse signal are inputted; and a latch unit suitable for buffering a signal of the predetermined node to generate the pre-fuse signal and suitable for latching the signal of the predetermined node.

18. The semiconductor device of claim 17:

wherein the first pulse of the initialization pulse signal is generated after the first selection pulse is generated; and wherein the second pulse of the initialization pulse signal is generated after the second selection pulse is generated.

19. A semiconductor system comprising:

a controller suitable for generating a period signal; and a semiconductor device suitable for generating a first selection pulse, a second selection pulse and an initialization pulse signal in response to the period signal, suitable for generating a first fuse signal for controlling an internal operation according to a cut state of a first fuse in response to the first selection pulse, and suitable for generating a second fuse signal for controlling the internal operation according to a cut state of a second fuse in response to the second selection pulse.

20. The semiconductor system of claim 19:

wherein the first selection pulse, the second selection pulse and the initialization pulse signal are generated from a point of time that an enabled period of the period signal terminates; and wherein the enabled period of the period signal terminates when a power voltage signal reaches a predetermined level.

* * * * *